| (12) | United States Patent | (10) Patent No.: | US 9,112,028 B2 |
|---|---|---|---|
| | Goel et al. | (45) Date of Patent: | Aug. 18, 2015 |

(54) METHODS OF CONTAINING DEFECTS FOR NON-SILICON DEVICE ENGINEERING

(71) Applicant: Intel Corporation, Santa Clara, CA (US)

(72) Inventors: Niti Goel, Portland, OR (US); Ravi Pillarisetty, Portland, OR (US); Niloy Mukherjee, Beaverton, OR (US); Robert S. Chau, Beaverton, OR (US); Willy Rachmady, Beaverton, OR (US); Matthew V. Metz, Portland, OR (US); Van H. Le, Portland, OR (US); Jack T. Kavalieros, Portland, OR (US); Marko Radosavljevic, Portland, OR (US); Benjamin Chu-Kung, Hillsboro, OR (US); Gilbert Dewey, Hillsboro, OR (US); Seung Hoon Sung, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/263,708

(22) Filed: Apr. 28, 2014

(65) Prior Publication Data

US 2014/0231871 A1    Aug. 21, 2014

Related U.S. Application Data

(63) Continuation of application No. 13/631,417, filed on Sep. 28, 2012, now Pat. No. 8,716,751.

(51) Int. Cl.
*H01L 21/02* (2006.01)
*H01L 29/78* (2006.01)
(Continued)

(52) U.S. Cl.
CPC .... *H01L 29/7849* (2013.01); *H01L 21/823807* (2013.01); *H01L 21/845* (2013.01); *H01L 27/092* (2013.01); *H01L 27/1203* (2013.01)

(58) Field of Classification Search
USPC .......................................... 257/190; 438/142
See application file for complete search history.

(56) References Cited

U.S. PATENT DOCUMENTS

| 7,037,790 | B2 | 5/2006 | Chang et al. |
| 7,682,859 | B2 | 3/2010 | Cheng et al. |

(Continued)

FOREIGN PATENT DOCUMENTS

| CN | 101032032 | 9/2007 |
| TW | 594990 | 6/2004 |

OTHER PUBLICATIONS

Intel Corporation, International Search Report and Written Opinion mailed Sep. 24, 2013 for PCT/US2013/047385.

(Continued)

*Primary Examiner* — David Vu
*Assistant Examiner* — Brandon Fox
(74) *Attorney, Agent, or Firm* — Blakely, Sokoloff, Taylor & Zafman LLP

(57) ABSTRACT

An apparatus including a device including a channel material having a first lattice structure on a well of a well material having a matched lattice structure in a buffer material having a second lattice structure that is different than the first lattice structure. A method including forming a trench in a buffer material; forming an n-type well material in the trench, the n-type well material having a lattice structure that is different than a lattice structure of the buffer material; and forming an n-type transistor. A system including a computer including a processor including complimentary metal oxide semiconductor circuitry including an n-type transistor including a channel material, the channel material having a first lattice structure on a well disposed in a buffer material having a second lattice structure that is different than the first lattice structure, the n-type transistor coupled to a p-type transistor.

15 Claims, 8 Drawing Sheets

(51) Int. Cl.
*H01L 21/84* (2006.01)
*H01L 27/12* (2006.01)
*H01L 21/8238* (2006.01)
*H01L 27/092* (2006.01)

(56) References Cited

U.S. PATENT DOCUMENTS

| | | | |
|---|---|---|---|
| 8,217,383 | B2 | 7/2012 | Hudait et al. |
| 8,237,151 | B2 | 8/2012 | Lochtefeld |
| 2004/0198003 | A1 | 10/2004 | Yeo et al. |
| 2009/0061572 | A1 | 3/2009 | Hareland et al. |
| 2009/0166769 | A1 | 7/2009 | Metz et al. |
| 2009/0315114 | A1 | 12/2009 | Rakshit et al. |
| 2012/0012934 | A1 | 1/2012 | Shah et al. |
| 2013/0040431 | A1* | 2/2013 | Ye et al. .................. 438/285 |
| 2013/0099282 | A1* | 4/2013 | Chen et al. .................. 257/190 |

OTHER PUBLICATIONS

Intel Corporation, Notice of Allowance for U.S. Appl. No. 13/631,417 mailed Dec. 24, 2013.
Intel Corporation et al., Taiwan Office Action dated Jan. 28, 2015 for TW App No. 102133628.
Intel Corporation, "International Preliminary Report on Patentability," mailed Apr. 9, 2015 for PCT/US2013/047385.

* cited by examiner

METHODS OF CONTAINING DEFECTS FOR NON-SILICON DEVICE ENGINEERING

CROSS-REFERENCE TO RELATED APPLICATION

The application is a continuation of U.S. patent application Ser. No. 13/631,417, filed Sep. 28, 2012 (issued as U.S. Pat. No. 8,716,751) and incorporated herein by reference.

FIELD

Semiconductor devices.

BACKGROUND

For the past several decades, the scaling of features in integrated circuits has been a driving force behind the semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased capacity. The drive for ever-more capacity, however, is not without issue. The desire to optimize the performance of each device becomes increasingly significant.

A significant potential for enhanced performance of both P- and N-channel field effect transistors (FETs) is the use of channel materials with large lattice mismatches with respect to silicon. Devices formed in epitaxially grown semiconductor hetero-structures, such as in Group III-V material systems, for example, offer exceptionally high carrier mobility in the transistor channels due to low effective mass along with reduced impurity scattering by delta doping. These devices provide high drive current performance and appear promising for future low power, high speed logic applications. Along with a large lattice mismatch, however, is the problem of threading dislocation densities (TDDs) or defects that adversely impact device yield. For complementary metal oxide semiconductor (CMOS) implementation, the co-integration of lattice mismatched materials like Group III-V and germanium (Ge) based on a silicon or an SOI substrate is a big challenge.

DETAILED DESCRIPTION

Semiconductor devices and methods of forming and using semiconductor device are described. Also described is the co-integration of NMOS and PMOS devices formed of materials such as Group III-V compound semiconductor (for NMOS) and germanium (for PMOS) materials on silicon for CMOS implementation. Techniques to reduce defects propagating to device layers are also presented.

Figure 1:
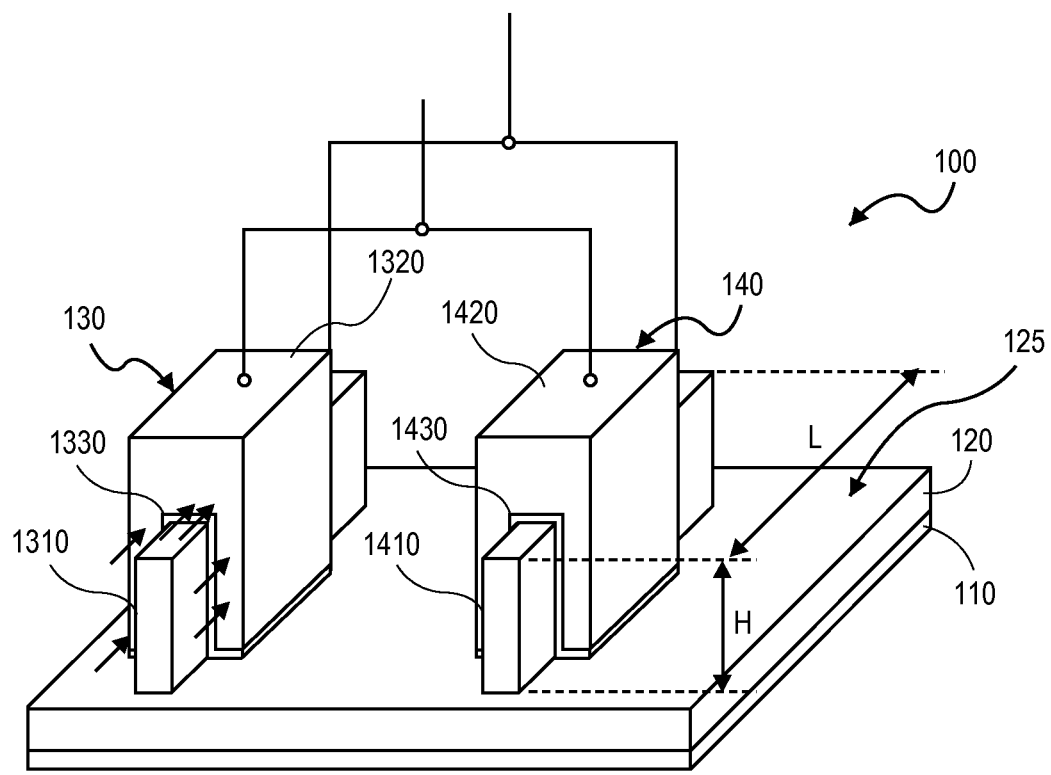
FIG. 1 shows a top front perspective view of an embodiment of a structure including a NMOS tri-gate device and a PMOS tri-gate device on a substrate in a CMOS implementation.

FIG. 1 illustrates an embodiment of a portion of a silicon or SOI substrate including non-planar metal oxide semiconductor field effect transistors (MOSFETs). Structure 100 is, for example, a portion of an integrated circuit or chip. Specifically, FIG. 1 shows two tri-gate devices integrated on a substrate for CMOS. It is appreciated that a substrate may contain many more such devices as well as different devices (e.g., planar devices). Referring to FIG. 1, structure 100 includes substrate 110 of silicon or SOI. Overlying silicon substrate 110 is buffer layer 120. In one embodiment, buffer layer 120 is a silicon germanium buffer, such as $Si_{0.3}Ge_{0.7}$ material modified as subsequently described herein that is introduced, in one embodiment, on substrate 110 by a growth technique. Buffer layer 120 has a representative thickness of a few hundred nanometers (nm).

In one embodiment, disposed on a surface of buffer layer 120 (as viewed) is n-type transistor device 130 and p-type transistor device 140. N-type transistor device 130 includes fin 1310 is disposed on surface 125 of buffer layer 120. A representation material for fin 1310 is a Group III-V compound semiconductor material such as an indium gallium arsenide (InGaAs) material. In one embodiment, fin 1310 has a length dimension L, greater than a height dimension. A representative length range is on the order of 10 nm to one millimeter (mm) and a representative height range is on the order of five nm to 200 nm. Fin 1310 of n-type transistor of device 130 is a three-dimensional body extending from a surface of buffer layer 120. The three-dimensional body is illustrated in FIG. 1 as a rectangular body but it is appreciated that in the processing of such bodies, a true rectangular form may not be achievable with available tooling and other shapes may result. Representative shapes include, but are not limited to, a trapezoidal shape (e.g., base wider than top and an arch shape).

Overlying fin 1310 is gate dielectric layer 1330 representatively composed of a high-K material such as, but not limited to, aluminum oxide ($Al_2O_3$) or hafnium oxide ($HfO_2$) and overlying gate oxide layer is gate 1320 having a representative thickness in the order of three nm.

Overlying gate dielectric layer 1330 is gate 1320. Gate 1320 is, for example, a metal material such as, but not limited to, a metal nitride, a metal carbide, a metal silicide, hafnium, zirconium, titanium, tantalum, aluminum, ruthenium, palladium, platinum, cobalt, or nickel.

Gate 1320 separates source and drain regions of the device with a channel region disposed in the side beneath the gate. Channel region is disposed in fin 1310 beneath the gate. In this manner, rather than current flowing in a plane underneath the gate as with planar transistor operation, current flows on the top side and opposing side walls of the fin as illustrated.

FIG. 1 also shows p-type transistor device 140 that is, for example, a three-dimensional device formed on a surface of buffer layer 120. P-type transistor device 140 includes fin 1410 illustrated having a rectangular shape. In one embodiment, p-type fin 1410 is a germanium material. Overlying fin 1410 is gate dielectric layer 1430 representatively of a high-K material such as, but not limited to, $Al_2O_3$ or $HfO_2$ having a representative thickness on the order of three nm. Overlying gate dielectric 1430 is gate 1420 of, for example, a metal gate of materials described above. Like an n-type device, gate 1420 is disposed between source and drain regions of fin 1410 and a channel region of fin 1410 is disposed beneath the gate.

To indicate a CMOS configuration, the gates and drains of device 130 and device 140 are illustrated as connected.

Figure 2:
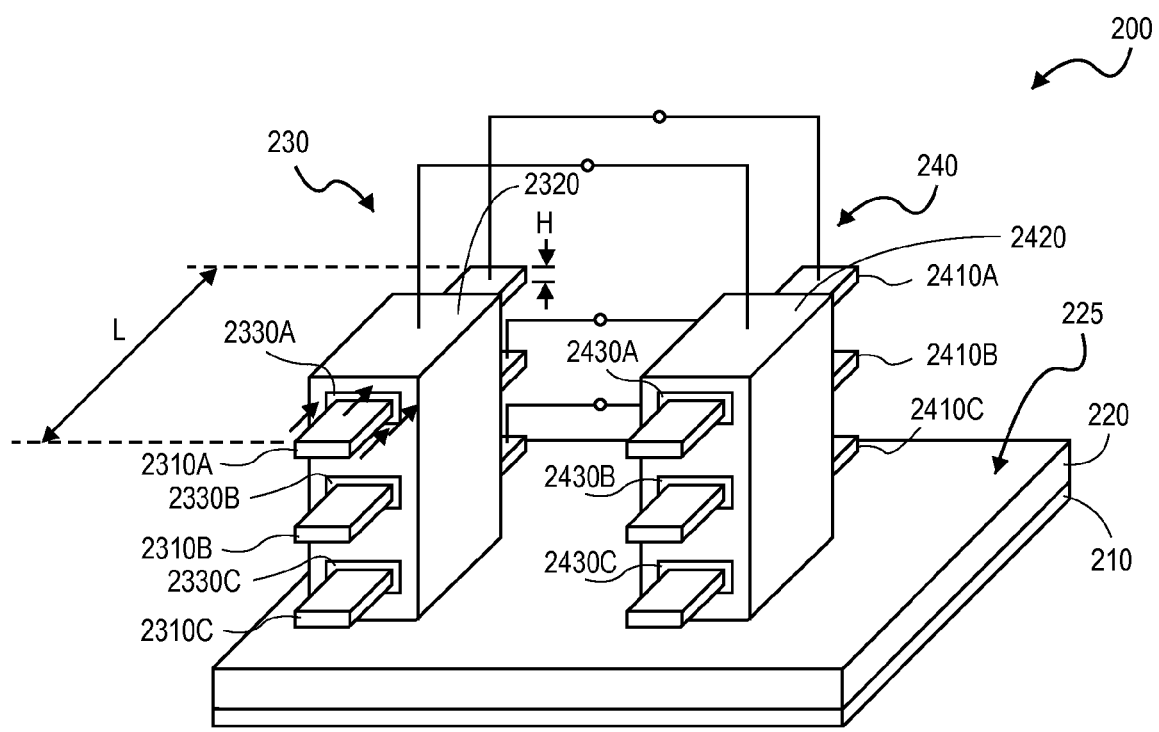
FIG. 2 shows a top front perspective view of another embodiment of a structure including NMOS gate all-around device and a PMOS gate all-around device in a CMOS implementation.

FIG. 2 shows another embodiment of a semiconductor structure. Similar to structure 100, structure 200 includes three-dimensional MOSFET devices. More particularly, gate-all-around (GAA) FETs are described. Referring to FIG. 2, structure 200 includes substrate 210, that is silicon or SOI. Overlying substrate 210 is buffer layer 220 of, for example, a silicon germanium material (e.g., $Si_{0.3}Ge_{0.7}$ buffer material) modified as subsequently described. On surface 225 of buffer layer 220 are n-type device 230 and p-type device 240. N-type device 230 includes multiple fins aligned in a stack arrangement (one over another). In this embodiment, n-type device 230 includes fins 2310A, 2310B, 2310C. It is appreciated that a GAA FET such as n-type device 230 may have less than three fins (e.g., two fins) or more than three fins (e.g., four fins, five fins, etc.). In one embodiment, each fin is a Group III-V compound semiconductor material such as InGaAs. As illustrated, each fin has a length, L, dimension that is greater than a height, H, dimension. Surrounding each fin 2310A, 2310B, 2310C is gate dielectric materials 2330A, 2330B and 2330C representatively of a high K material such as $Al_2O_3$ or $HfO_2$ having a representative thickness on the order of three nm. Overlying the gate oxide materials and surrounding each side of the respective fins is gate 2320 of, for example, a metal material such as described above. Gate 2320 separates source and drain regions of each fin 2310A, 2310B and 2310C and defines a channel between their respective source and drain regions. With gate 2320 completely surrounding the channel, current can flow on four sides of each of fins 2310A, 2310B and 2310C.

Structure 220 of FIG. 2 also shows p-type device 240. In this embodiment, device 240 includes three fins in a stacked arrangement (one over the next). It is appreciated that a GAA FET such as p-type device 240 may have less than three fins (e.g., two fins) or more than three fins (e.g., four fins, five pins). Fins 2410A, 2410B and 2410C are representatively a germanium (Ge) material. Surrounding each fin 2410A, 2410B and 2410C is gate dielectric materials 2430A, 2430B and 2430C, respectively representatively of a high K material such as $Al_2O_3$ or $HfO_2$. Overlying the gate dielectric materials and surrounding each fin is gate 2420 of, for example, a metal material. Gate 2420 defines source and drain regions in each of fins 2410A, 2410B and 2410C and channel regions between the source and drain regions.

To illustrate a CMOS implementation, gate 2320 of n-type device 230 is connected to gate 2420 of p-type device 240. Drain regions of each device are also connected.

In FIG. 2, n-type 230 and p-type device 240 are each shown including fins and gates of a rectangular or cuboid shape. It is appreciated that other shapes may be desired or that in the processing of such structures or bodies, a true rectangular form may not be achievable with available tooling and other shapes may result. Representative examples include, but are not limited to, shapes that are rounded, shapes that look like pedestals (where the structure is narrower in the middle and wider at the top and/or bottom), shapes that look like hearts (e.g., shapes with a indentation in either the top or bottom surface), shapes that look like pin cushions (e.g., shapes with an indentation in both the top and bottom surfaces), and trapezoid shapes.

In the embodiments described above with respect to FIG. 1 and FIG. 2, three-dimensional devices are described on a silicon or SOI structure. In order to minimize the defects in the device layers (e.g., the fins) of each device as illustrated, the devices are fabricated in such a way to capture defects along and perpendicular to a fin length direction prior to device formation. One way this may be accomplished is by capturing such defects in the volume of a modified buffer layer.

Figure 3:
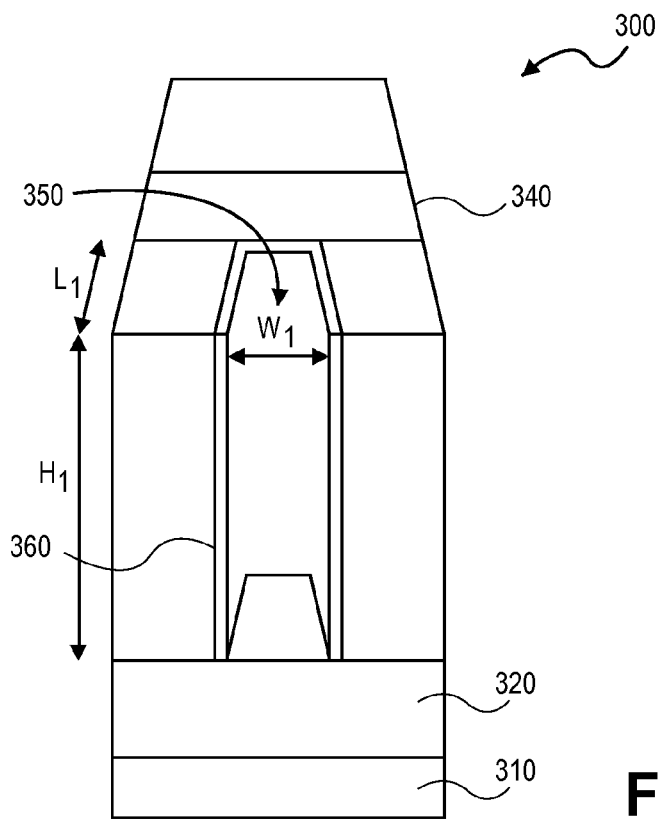
FIG. 3 shows a top perspective view of a substrate base and a buffer material on the substrate base and a well trench formed in the buffer in an area designated for an NMOS structure.

FIG. 3 shows a top front view of a structure including a substrate base and a buffer material on the substrate base. Referring to FIG. 3, structure 300 includes substrate 310 of, for example, silicon or SOI. Overlying substrate 310, in this embodiment, is buffer layer 320 of, for example, a silicon germanium buffer material (e.g., $Si_{0.3}Ge_{0.7}$). In one embodiment, a material for buffer layer 320 is common for both n-type and p-type devices to be formed on the structure. FIG. 3 shows a well trench formed in buffer layer 320 in an area designated for an n-type device or devices. Well trench 350 has dimensions such that its length, $L_1$, is less than its height, $H_1$, and the width, $W_1$, of the trench is less than the height, $H_1$. In one embodiment, well trench 350 has a representative height, $H_1$, on the order of greater than 100 nanometers (nm), a length, $L_1$, on the order of 60 nm, and a width, $W_1$, on the order of 40 nm or 50 nm. In another embodiment, $L_1$ and $W_1$, may be similar such as each 60 nm to describe a bidirectional trapping or square trench trapping confirmation. FIG. 1 also shows trench isolation (STI) 340 formed laterally (in a width direction) in a superior surface (as viewed) of buffer layer 320. STI 340, in one embodiment, defines a length dimension, $L_1$, for well trench 350 and will define a length dimension of a fin or fins that are to be formed on buffer layer 320. Finally, FIG. 3 shows spacer material 360 lining the walls of well trench 350. In one embodiment, spacer material 360 is silicon nitride having a representative thickness of five nm.

Figure 4:
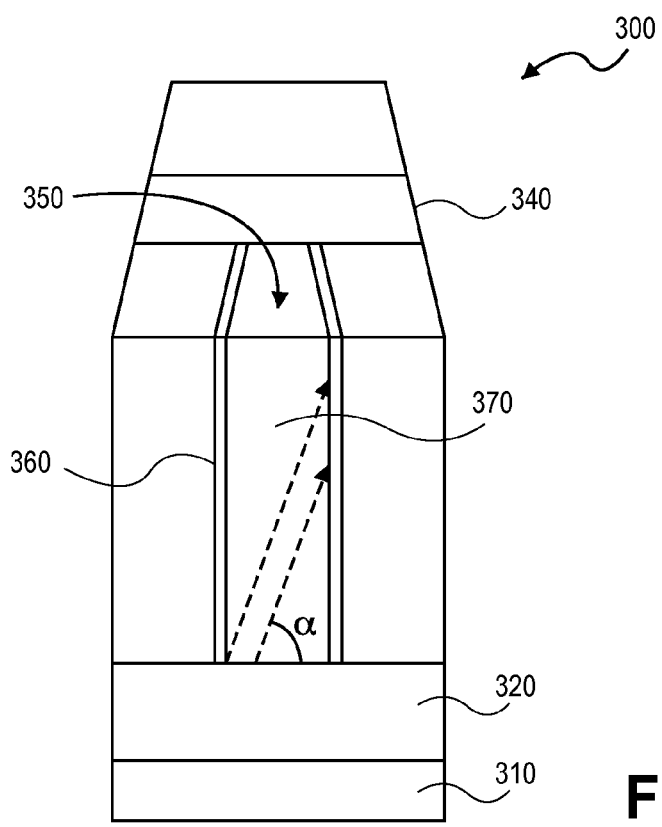
FIG. 4 shows the structure of FIG. 3 following the introduction of a defect capture material into the well trench.

FIG. 4 shows the structure of FIG. 3 following the introduction of an n-type material in well trench 350. One suitable n-type material for introduction into well trench 350 is a material that has a high band gap property. A high band gap material below a device layer will tend to confine charges in the active layer. In one embodiment, well material 370 is also selected such that it has lattice characteristics that match characteristics of a device layer or are an intermediate between the device layer and buffer layer 320. A representative material is a Group III-V compound semiconductor material, such as indium phosphide (InP). One way to introduce well material 370 into well trench 350 is by growing the material in the trench using molecular beam epitaxy (MBE), metal organic vapor phase epitaxy (MOVPE), or metal organic chemical vapor deposition (MOCVD). Well material 370 is introduced such that the width and length dimensions of the well are maintained much smaller than the height of well trench 350. Maintaining a width and length dimension of well material 370 lower than a height dimension allows a capture of defects along side walls of the well and inhibits defects from reaching a surface of the formed well. Representatively, in face centered cubic crystals such as silicon, germanium, gallium arsenide, indium gallium arsenide, threading dislocations (TDs) tend to glide along the {111} planes in the <110> direction. {111} planes are approximately 55° to {100} planes. Thus, TDs can be terminated on side walls of well material 370 if a trench aspect ratio height/width and height/length is greater than approximately 1.5 (equivalent to the tangent of alpha where alpha is 54.7°).

Figure 5:
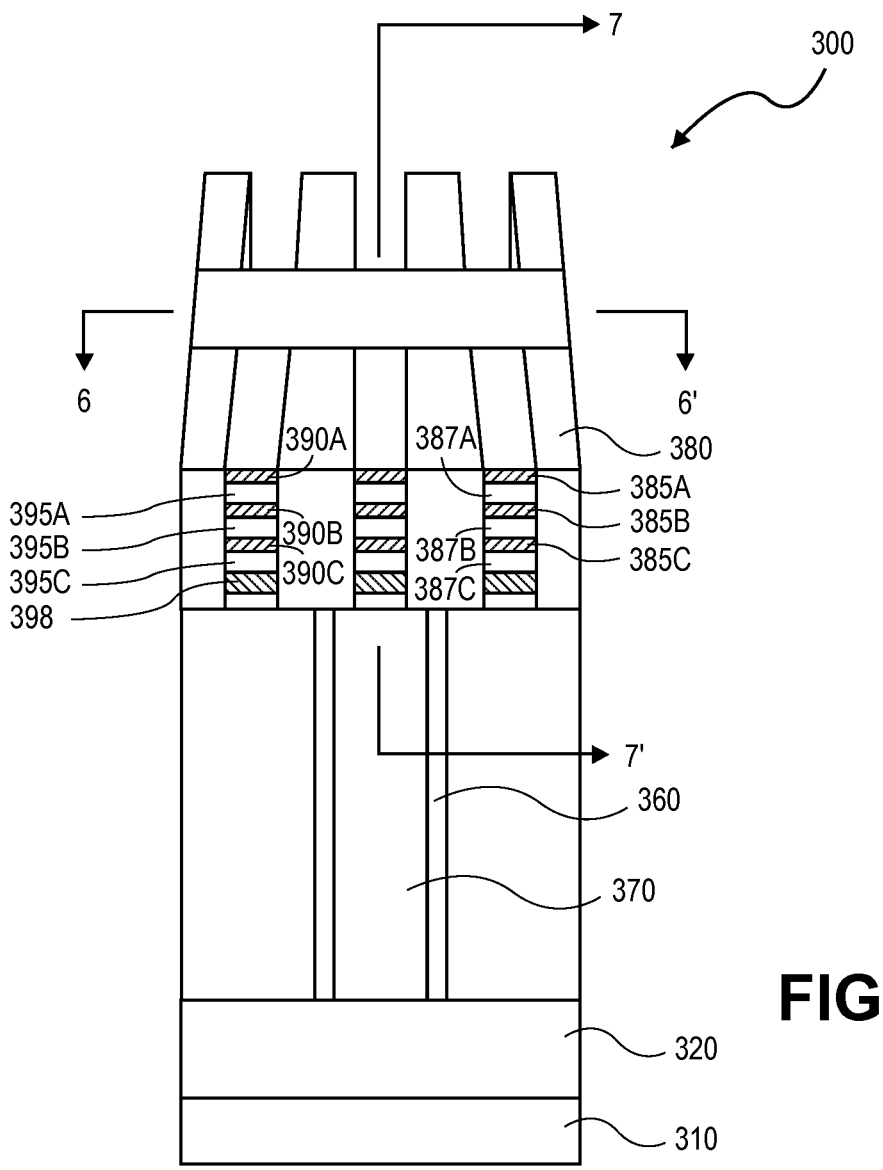
FIG. 5 shows the structure of FIG. 4 following patterning of isolated areas for NMOS and PMOS structures on a superior surface of the buffer material and the introduction of device layers in the areas.

FIG. 5 shows the structure of FIG. 4 following STI patterning on a superior surface of buffer layer 320. In one embodiment, STI 380 defines the length and width dimensions for fins that are formed on the buffer layer. STI layer 380 defines active regions over well material 370 for n-type devices and areas adjacent well material 370 for p-type devices. Representatively, the active areas defined by STI 380 are 10 nm to 20 nm wide. The thickness or height dimension of STI 380 is representatively up to 100 nm above well material 370 and a corresponding well of buffer layer 320 for a p-type device or devices.

FIG. 5 also shows structure 300 following the introduction of device layers in the active areas defined by STI 380. In the embodiment described, multiple fins are formed in an active area to representatively form a gate-all-around structure similar to FIG. 2. FIG. 5 shows active device layers 385A, 385B and 385C stacked one over the other and separated by sacrificial layers 387A, 387B and 387C in a p-type active area. In one embodiment, active device layers 385A, 385B and 385C are compressively strained Ge having a thickness or height on the order of 5 nm and a width on the order of 10 nm to 15 nm. In one embodiment, SiGe sacrificial layers 387A, 387B and 387C each have a thickness or height on the order 15 nm.

Over well material 370 in an n-type active area are active device layers 390A, 390B and 390C stacked one over the other and separated by sacrificial layers. In one embodiment, active device layers 390A, 390B and 390C are a Group III-V compound semiconductor material such as InGaAs each layer having a thickness on the order of approximately 5 nm and a width on the order of 10 nm to 15 nm. Representatively, sacrificial layers 395A, 395B and 395C disposed between active device layers 390A, 390B and 390C are InP material having a thickness or height on the order of 15 nm.

Figure 7:
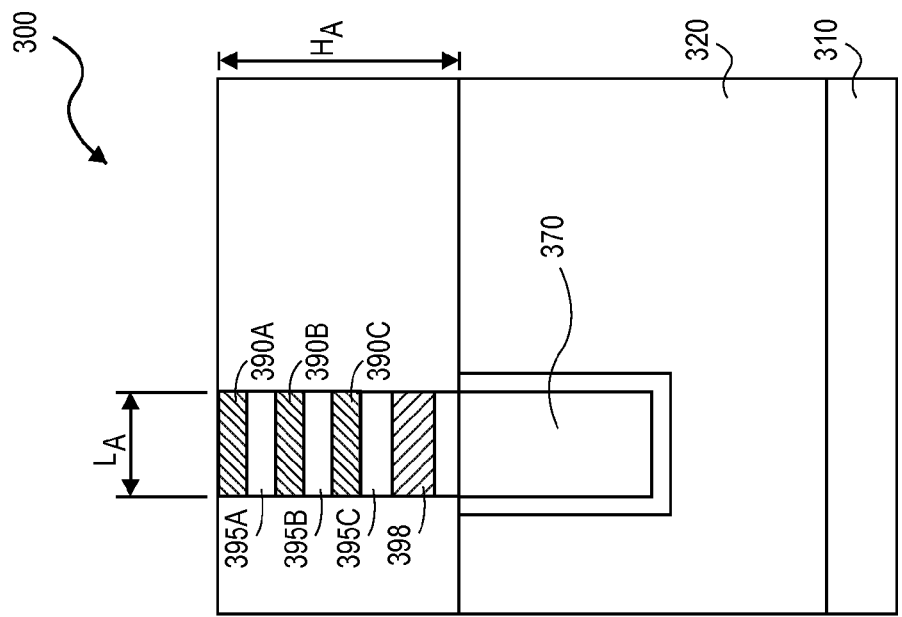
FIG. 7 shows a cross-section of the structure of FIG. 5 through line 7-7'.
Figure 6:
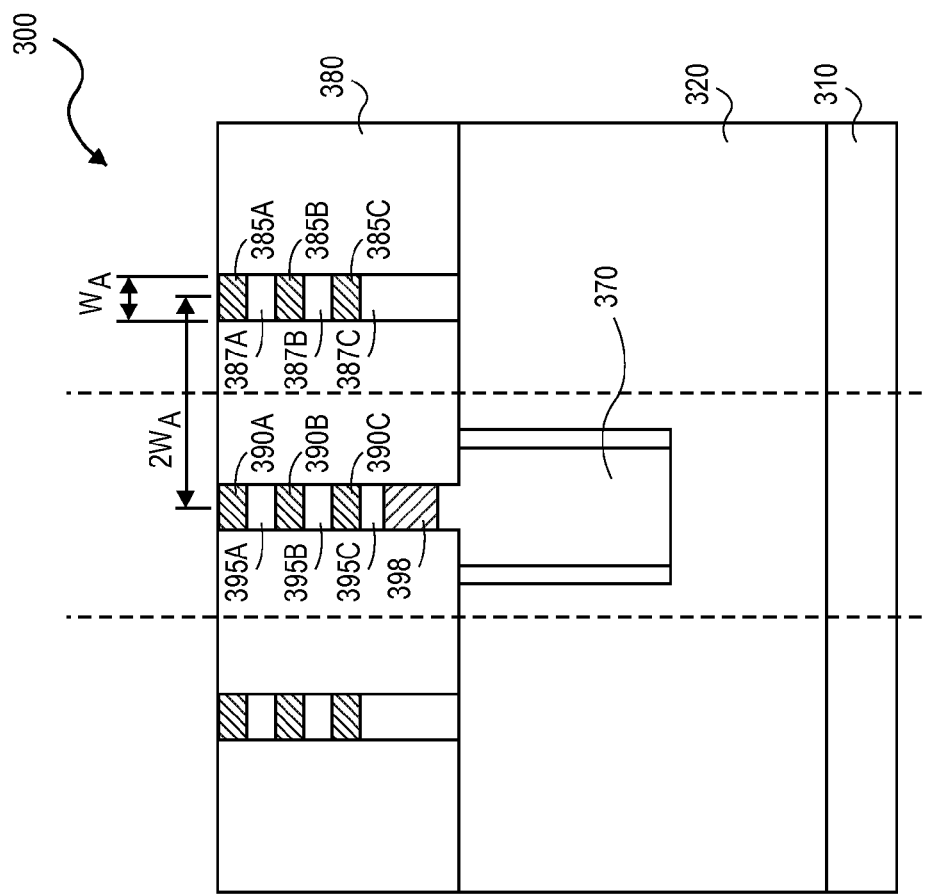
FIG. 6 shows a cross-section of the structure of FIG. 5 through line 6-6'.

FIG. 6 shows a cross-section of structure 300 through line 6-6'. FIG. 7 shows a cross-section of structure 300 through line 7-7' of FIG. 5. In FIG. 6, both n-type region and p-type region are visible. In FIG. 7, only the n-type region is visible. Referring to FIG. 6, in the p-type region or area, FIG. 6 shows active device layers 385A, 385B and 385C of, for example, a strained Ge material each separated by sacrificial layers 387A, 387B and 387C of, for example, SiGe similar to a material of buffer layer 320. FIG. 6 also shows active device layers 390A, 390B and 390C of a Group III-V compound semiconductor material in an n-type region or area with sacrificial layers 395A, 395B and 395C of, for example, InP material disposed adjacent the respective active device layers. In one embodiment, the active device layers (in both p- and n-type regions) have a representative width, $W_A$, on the order of 10 nm. The p-type region active device layers are shown separated from the n-type region active device layers by a distance of twice the width, $2W_A$. Below the lowest sacrificial layer 395C as viewed, FIG. 6 also shows optional supplemental buffer layer 398 that provides similar or identical lattice matching to active device layers 390A, 390B and 390C. In one embodiment, supplemental buffer material 398 is indium aluminum arsenide (InAlAs).

Referring to FIG. 7, in one embodiment, active device layers 390A, 390B and 390C have a length, $L_A$, on the order of 100 nm. A representative height, $H_A$, of the stack of active device layers and sacrificial layers of each well is, for example, on the order of 100 nm.

Figure 8:
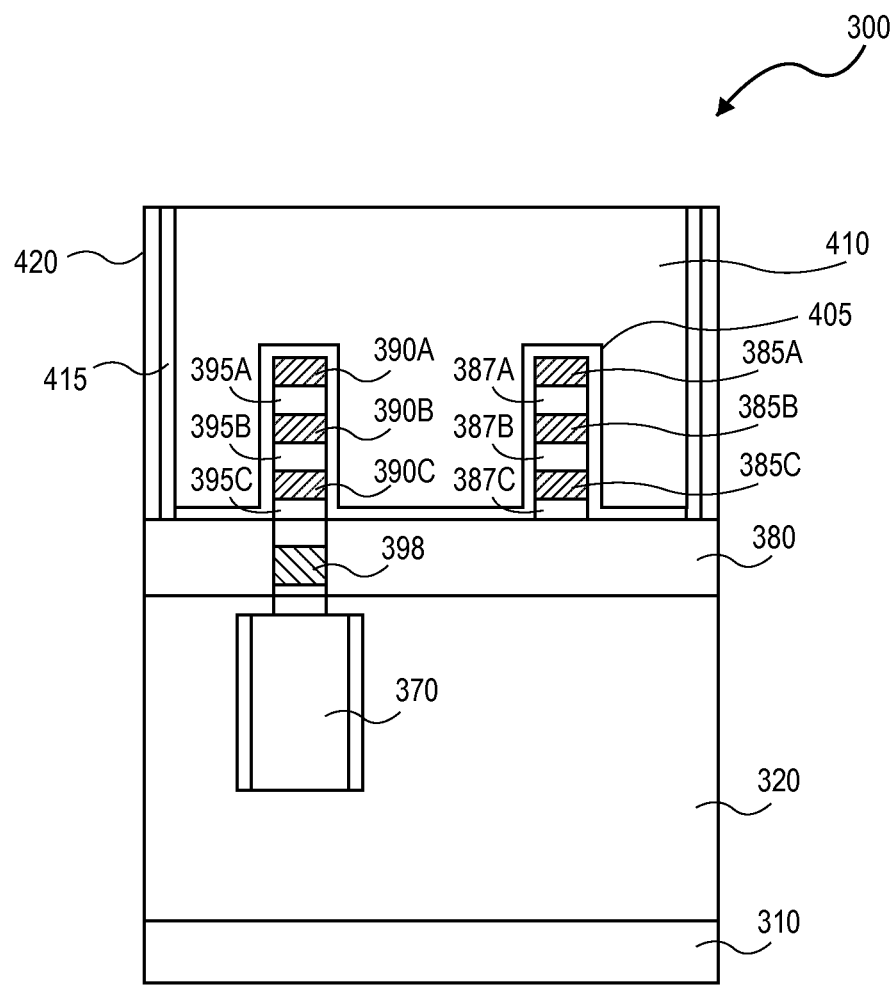
FIG. 8 shows a cross-section of the structure of FIG. 5 through line 6-6' following the introduction of a sacrificial gate oxide and sacrificial gate over the device layers.

FIG. 8 shows a cross-sectional view of structure 300 through, for example, line 6-6' in FIG. 5, and illustrates two active device layer stacks, one p-type and one n-type. Following the formation of the active device layers, the stacks of device layers are exposed by removing STI 380 adjacent the stacks by, for example, etching. This is followed by the introduction of a sacrificial gate oxide layer 405 and a sacrificial gate 410 of, for example, polysilicon material. Sacrificial gate oxide layer 405 and sacrificial gate material 410 are blanket deposited and patterned with, for example, plasma etch process, to replicate dimensions of desired gate/gate dielectric structures over active device layers 385A-385C and 390A-390C.

Figure 9:
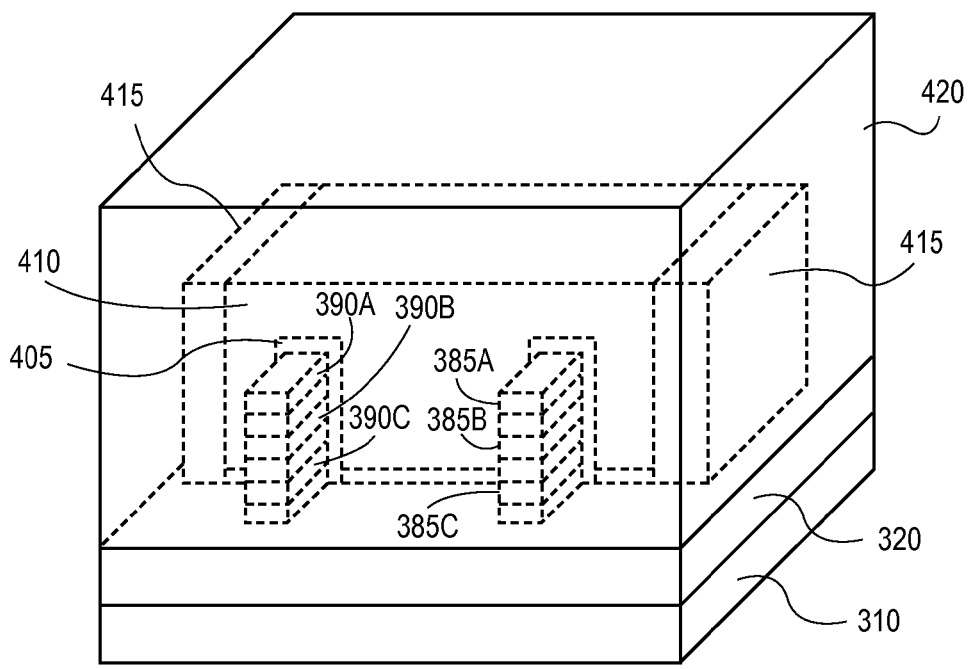
FIG. 9 shows a top, front perspective view of the structure of FIG. 8 following patterning of the sacrificial gate, doping of the exposed portions of device layers and the deposition of a dielectric layer on the structure.

Following patterning to form the sacrificial gates/gate dielectric, spacers 415 of, for example, silicon nitride may be formed on the side walls of sacrificial gate 410 and doping performed in active device layers 385A-385C and active device layers 390A-390C (e.g., tip and/or source- and drain-type doping). FIG. 9 shows the structure of FIG. 8 following the introduction of dielectric layer 420 such as an oxide covering sacrificial gate 410, spacers 415, and exposed portions of active device layers 385A-385C and 390A-390C.

Figure 10:
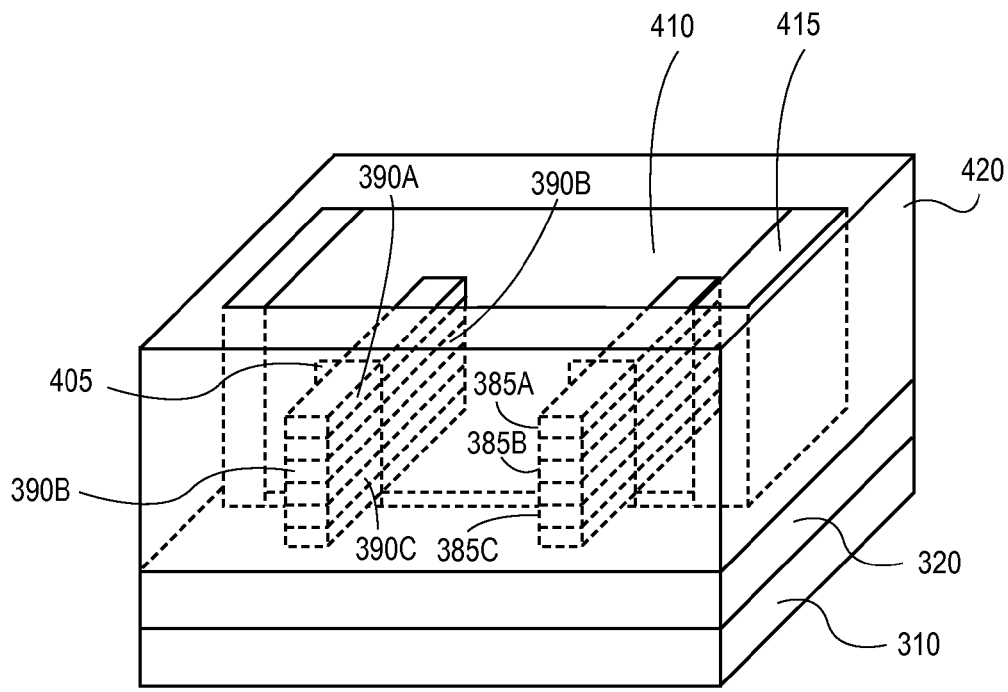
FIG. 10 shows the structure of FIG. 9 following the exposure of the sacrificial gate in the dielectric layer.

Following dielectric layer 420 formation, sacrificial gate 410 and spacers 415 are exposed by, for example, polishing dielectric layer 420. Sacrificial gate 410 and sacrificial gate oxide layer 405 are then removed by, for example, etching to expose channel portions of active device layers 385A-385C and active device layers 390A-390C as shown in FIG. 10.

Portions of the intervening sacrificial layers 387A, 387B and 387C are removed to leave active device layers 385A, 385B and 385C and sacrificial layers 395B and 395C are removed to the active device layers 390A, 390B and 390C. Such removal may be done by selective wet etch subsequently, device fabrication proceeds in the introduction of, for example, a high gate dielectric material around the channel region of each active device layers 385A, 385B and 385C and active device layers 390A, 390B and 390C. This is followed by the introduction of a desired gate material such as a p-type metal gate for the p structure and an n-type metal gate for the n structure. Such gate may be formed by protecting an n-type area while the p-type gate material is introduced and protecting a p-type area while the n-type metal gate is introduced. Finally, contacts are made between the gates and drain region of the formed device to provide a CMOS configuration. The final configuration is illustrated in FIG. 2. Other contacts (e.g., source contacts) may also be added at this time.

Figure 11:
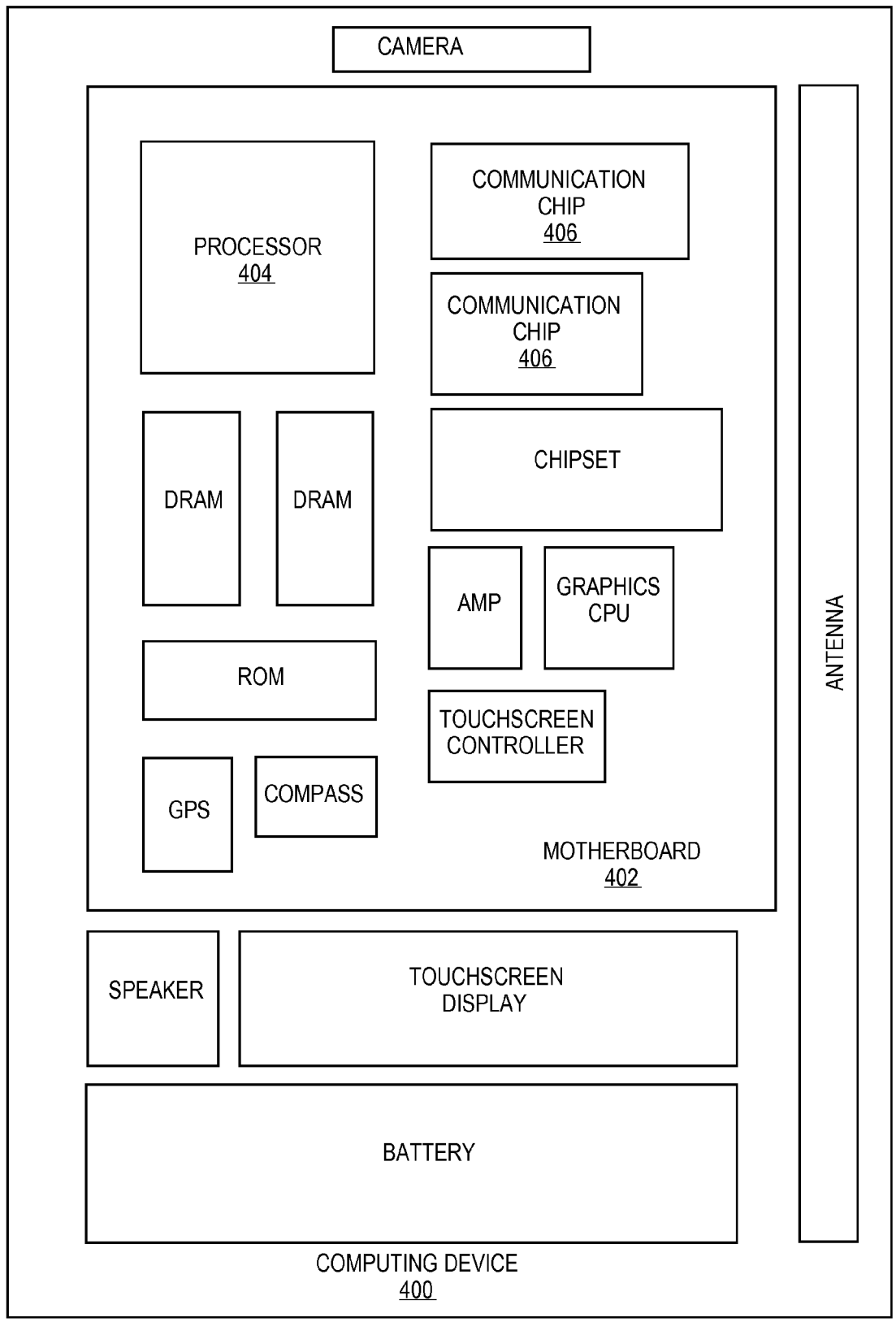
FIG. 11 illustrates a schematic illustration of a computing device.

FIG. 11 illustrates a computing device 400 in accordance with one implementation of the invention. Computing device 400 houses board 402. Board 402 may include a number of components, including but not limited to processor 404 and at least one communication chip 406. Processor 404 is physically and electrically coupled to board 402. In some implementations the at least one communication chip 406 is also physically and electrically coupled to board 402. In further implementations, communication chip 406 is part of processor 404.

Depending on its applications, computing device 400 may include other components that may or may not be physically and electrically coupled to board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, first communication chip 406 may be dedicated to shorter range wireless communications such as Wi-Fi and Bluetooth and second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. In some implementations of the invention, the integrated circuit die of the processor includes one or more devices, such as transistors and CMOS implementations, that are formed in accordance with embodiments herein. The term "processor" may refer to any device or portion of a device that processes electronic data from registers and/or memory to transform that electronic data into other electronic data that may be stored in registers and/or memory.

Communication chip 406 also includes an integrated circuit die packaged within communication chip 406. In accordance with another implementation, the integrated circuit die of the communication chip includes one or more devices, such as transistors and CMOS implementations, that are formed in accordance with implementations described above.

In further implementations, another component housed within computing device 400 may contain an integrated circuit die that includes one or more devices, such as transistors and CMOS implementations, that are formed in accordance with implementations described above In various implementations, computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising:
    a semiconductor device comprising a channel material having a first lattice structure on a well of a well material having a matched lattice structure, the well disposed in a buffer material having a second lattice structure that is different than the first lattice structure, wherein the well comprises dimensions of a height greater than each of a width and a length.

2. The apparatus of claim 1, wherein the semiconductor device comprises an n-type metal oxide semiconductor field effect transistor comprising a source region and a drain region of the channel material.

3. The apparatus of claim 1, wherein the channel material is a Group III-V compound semiconductor material.

4. The apparatus of claim 3, wherein the buffer material comprises Germanium.

5. The apparatus of claim 1, wherein the semiconductor device is a first semiconductor device comprising an n-type metal oxide semiconductor field effect transistor, the apparatus further comprising a second semiconductor device comprising a p-type metal oxide semiconductor field effect transistor on the buffer material.

6. The apparatus of claim 5, wherein the n-type transistor is connected to the p-type transistor through the gates and drains of each device.

7. A method comprising:
    forming a well trench in a buffer material of a substrate the well comprising dimensions of a height greater than each of a width and a length;
    forming an n-type well material in the well trench, the n-type well material having a lattice structure that is different than a lattice structure of the buffer material;
    defining an area for a channel and for junction regions for an n-type device on the well material; and
    forming an n-type transistor comprising a channel and junction regions in the defined area.

8. The method of claim 7, wherein the area for a channel and junction regions is defined by trench isolation.

9. The method of claim 7, wherein the n-type well material is a Group III-V compound semiconductor material.

10. The method of claim 9, wherein the buffer material comprises Germanium.

11. The method of claim 7, further comprising:
    defining a p-type area for a channel and for junction regions for a p-type device on the well material; and
    forming a p-type transistor comprising a channel and junction regions in the defined p-type area.

12. The method of claim 11, wherein the n-type transistor comprises a gate and the p-type transistor comprises a gate, and the junction regions of each transistor comprise a source region and a drain region, the method further comprising:
    connecting the n-type transistor to the p-type transistor through the gates and drains of each device.

13. A system comprising:
    a computer comprising a processor electrically coupled to a printed circuit board, the processor comprising complimentary metal oxide semiconductor (CMOS) circuitry including an n-type transistor and a p-type transistor, the n-type transistor comprising a channel material, the channel material having a first lattice structure on a well disposed in a buffer material having a second lattice structure that is different than the first lattice structure, wherein the well comprises dimensions of a height greater than each of a width and a length, wherein the n-type transistor is coupled to the p-type transistor through a gate and a drain of each device.

14. The system of claim 13, wherein the channel material of the n-type transistor is a Group III-V compound semiconductor material.

15. The system of the claim 13, wherein the buffer material comprises Germanium.

* * * * *